United States Patent [19]

Chen

[11] Patent Number: 5,600,713
[45] Date of Patent: Feb. 4, 1997

[54] ON-BOARD RING SIGNAL GENERATOR

[75] Inventor: Herbert M. K. Chen, Austin, Tex.

[73] Assignee: Advanced Micro Devices, Inc., Sunnyvale, Calif.

[21] Appl. No.: 340,386

[22] Filed: Nov. 15, 1994

[51] Int. Cl.$^6$ .................................................. H04M 19/02
[52] U.S. Cl. ........................... 379/375; 379/377; 379/373; 379/418
[58] Field of Search ..................... 379/375, 382, 379/373, 377, 418, 127, 163, 376

[56] References Cited

U.S. PATENT DOCUMENTS

| | | | |
|---|---|---|---|
| 3,904,833 | 9/1975 | Beene et al. | 379/418 |
| 4,110,569 | 8/1978 | Schindler et al. | 379/382 |
| 4,581,733 | 4/1986 | Sarson et al. | 370/67 |
| 4,675,899 | 6/1987 | Ahuja | 379/387 |
| 5,321,596 | 6/1994 | Hurst | 379/418 |

FOREIGN PATENT DOCUMENTS

| | | |
|---|---|---|
| 0234436 | 9/1987 | European Pat. Off. |
| 0255374 | 2/1988 | European Pat. Off. |
| 2051521 | 1/1981 | United Kingdom. |
| 2222056 | 2/1990 | United Kingdom. |

*Primary Examiner*—Thomas W. Brown
*Assistant Examiner*—Jacques M. Saint-Surin
*Attorney, Agent, or Firm*—Foley & Lardner

[57] ABSTRACT

A ring generator circuit that produces a ring output for a plurality of telephones simultaneously. The ring generator circuit includes a switch that receives an oscillating signal in response to an on condition of an on/off signal. The on/off signal is related to whether an incoming phone call is directed to one of the plurality of telephones or not. The ring generator circuit also includes a DC offset circuit that receives a DC input potential, an amplifier stage for providing a ring output, and a feedback circuit connected between the ring output of the amplifier stage and the switch output.

22 Claims, 4 Drawing Sheets

5,600,713

ON-BOARD RING SIGNAL GENERATOR

BACKGROUND OF THE INVENTION

1. Field of the Invention

This invention relates to a ring generator circuit that produces a ring output for a plurality of telephones simultaneously. More specifically, this invention relates to an on-board ring signal generator for use, for example, on fiber optic lines.

2. Description of the Related Art

Conventional ring generator circuits are typically large units located in a central telephone switching office (central office). In such installations, one ring generator circuit must drive many telephone lines at the same time. A line for each of the telephones is connected to the central office where the ring generator is located. Often, the telephone traffic results in a number of telephones ringing at the same time. Therefore, the ring generator circuit must be designed to drive many lines and ring many telephones simultaneously. The exact requirements of such ring generator circuits are based on traffic statistics of the number and frequency of telephone calls received in an office.

Increasing numbers of telephone users and the development of alternative communication and transmission techniques, such as fiber optic communications, have created new problems and requirements for ring generator circuits. For example, FIG. 1 shows a system in which the central office 1 sends information through ISDN network 3 over digital line 5. That information is received by ISDN network 7, in which telephones 10 connected to local lines 9 are rung. This system is in contrast to the more traditional system shown in FIG. 2, in which central office 1 rings each of lines 9 individually, even if the lines are on the same trunk.

Referring back to FIG. 1, in the case where digital line 5 is, for example, a fiber optic line, the line cannot carry the high power ring signal used in the traditional systems of FIG. 2. In the United States, such ring signals are specified at a DC level of −48 volts with an AC signal of 86 volts RMS. In view of the characteristics of the transmission media, such as the limitations of fiber optic cables, the need to provide local ring generators has become critical.

In one example, a local ring generator manufactured by SGS Thompson is expensive and produces only 60 volts RMS and 30 volts DC. Therefore, the SGS Thompson on-chip regulator cannot easily meet the current U.S. specifications for supplying ringing voltages for a plurality of telephone lines. Consequently, there is a need for a new local ring generator for ringing a plurality of lines and which can accommodate the current voltage specifications for both ringing and non-ringing conditions.

SUMMARY OF THE INVENTION

It is therefore an object of the invention to provide an on-board ring generator for generating the required voltages needed to meet current ringing specifications and for doing so at a low cost.

In accordance with this object, there is provided a subscriber line interface circuit (SLIC) for local ring generation on a line card with a ring generation circuit that provides a central office grade ring signal. The ring generator circuit according to the invention includes a switch having an output providing an oscillating signal in response to an ON condition of an on/off signal at a control input of the switch. The control input to the switch can be generated by a ring detection circuit which places the switch in a first condition, e.g. closed, when the phone line indicates a ring should be generated to indicate an incoming call and a second condition, e.g., off, when no ring is desired. The ring generator according to the invention also includes a DC offset circuit receiving a DC input potential at an input port of the DC offset circuit and outputting a DC offset potential at an output port of the DC offset circuit. According to the invention, an amplifier stage is connected to the output of the switch and the output port of the DC offset circuit for providing a ring output and a feedback circuit is connected between the ring output of the amplifier stage and the output of the switch.

Other objects, features, and advantages of the invention will be apparent to those of ordinary skill in the art from the following more detailed description.

BRIEF DESCRIPTION OF THE DRAWING

Exemplary embodiments of the invention are shown in the drawings, in which.

DETAILED DESCRIPTION OF THE PREFERRED EMBODIMENTS

Figure 1:
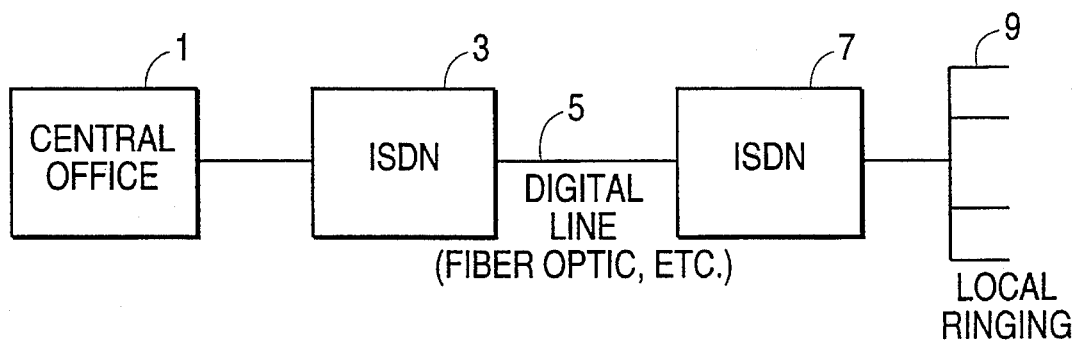
FIG. 1 shows a telephone system in which the central office is connected in an ISDN network, for example through non-metallic transmission media.
Figure 2:
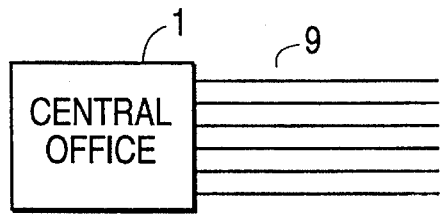
FIG. 2 shows a traditional telephone system in which the central office rings each of the lines individually.
Figure 3:
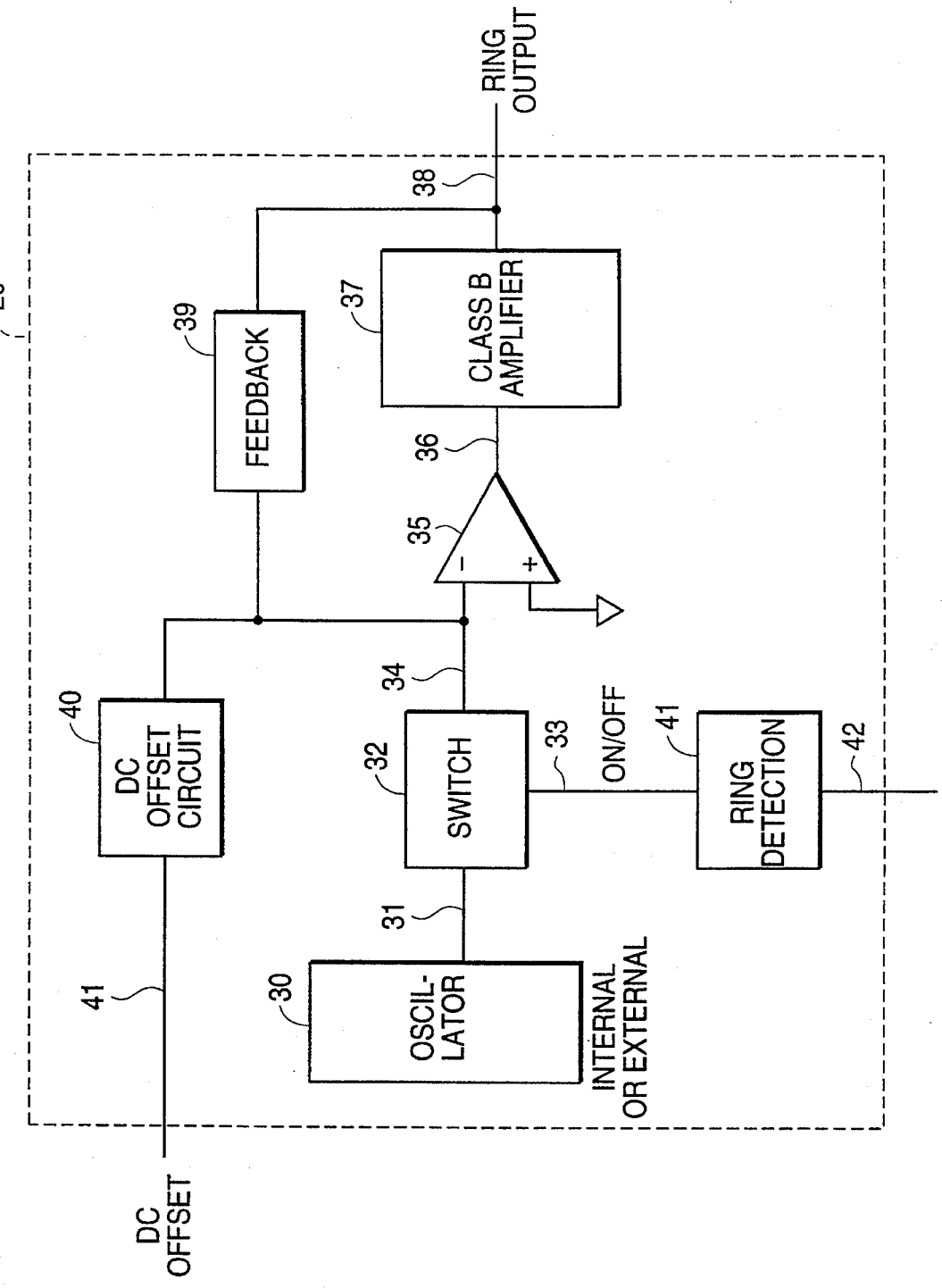
FIG. 3 is a block diagram of a ring circuit according to the invention.

FIG. 3 shows a ring generator circuit 20 according to the invention incorporated in a line card 22 as part of a subscriber line interface circuit (SLIC). FIG. 3 also shows a block diagram of the ring generating circuit 20 according to the invention. An oscillator 30 provides an oscillating signal on oscillator signal line 31 to the switch 32 which is responsive to the on/off signal on line 33. Switch 32 can be configured to receive a ring activation signal on line 33 directly from the phone line, or the on/off signal on line 33 can be generated from optional ring detection circuit 41 responsive to a signal from phone line 42 indicating the presence of an incoming call. The output of the switch 32 is switch signal line 34, which is provided to the amplifier 35. The output of the amplifier 35 on amplifier signal line 36 is provided to a class B amplifier 37 which produces a ring output 38. The ring output 38 is provided to a feedback circuit 39 which has an output end connected to the switch signal line 34. A DC offset circuit 40 receives as an input a DC offset voltage 41, and the output of the DC offset circuit 40 is connected to switch signal line 34. Thus, the amplifier 35 essentially acts as a summing amplifier. The amplifier 37 acts to minimize power dissipation for the ring generator circuit 20, while the feedback circuit 39 acts to control the output signal level 38 as well as to reduce the crossover distortion of the output signal.

With this implementation as shown in FIG. 3, a central office ring signal generator can be manufactured on an on-line card on a per-line basis at a low cost.

In the preferred embodiment, the oscillator 30 is an internal oscillator (i.e., on-chip), but it should be noted that oscillator 30 may be either an internal or external oscillator. For example, in a second embodiment of the invention, the signal line 31 can be connected to an external oscillator, in which case the amplifier 35 would directly receive an external oscillator input.

In a third embodiment, the on/off switch 32 would be configured to control the oscillator 30 itself, such that the oscillator 30 is connected to the amplifier when the on/off signal 33 is in the ON condition and does not connect when the on/off signal 33 is in the off condition. Referring to these three embodiments, any suitable arrangement of the switch 32 and oscillator 30 would be adequate as long as the input is provided to amplifier 35 on signal line 34 when it is necessary to ring the telephone.

In the preferred embodiment, the amplification block 37 is chosen to be a class B amplifier, since that type of amplifier has a low power dissipation characteristic. However, other types of amplifiers which have a low power dissipation property can be used for the amplification block 37. For example, an amplifier with a power dissipation of 25 milliwatts or less in idle state would work adequately as the amplification block 37.

Figure 4A:
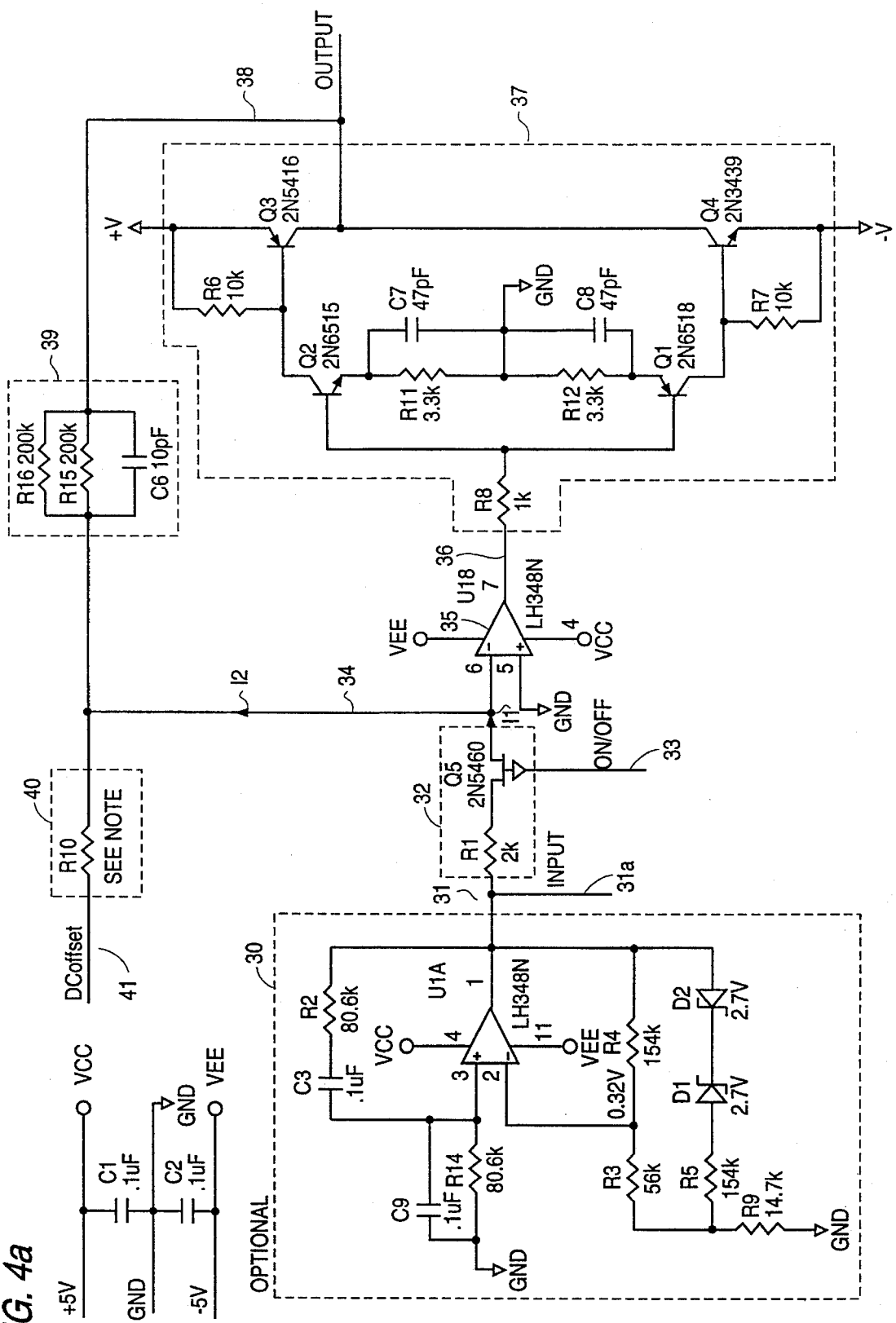
FIG. 4a is a detailed schematic of the ring circuit according to the invention.

FIG. 4a is a detailed schematic of a circuit used for implementing a ring generator according to the invention. The dotted lines in FIG. 4a correspond to the components shown in the block diagram of FIG. 3.

Oscillator 30 is of a conventional design and produces a 20 Hz 2.7 volt peak (5.4 volt peak-to-peak) signal on signal line 31. Diodes D1 and D2 provide soft clamping to set the peak voltage at 2.7 volts. As noted earlier, any type of oscillator can be used for generating a 20 Hz, 5.4 volt peak-to-peak signal on signal line 31. Also shown on FIG. 4a is input signal line 31a which can be used to supply the oscillating signal from an external source for the second and third embodiments in which the oscillator 30 is not incorporated into the on-board ringing circuit. Signal line 31 is routed to the switch Q5 which is responsive to the on/off on signal line 33. In the preferred embodiment, switch Q5 is a field effect transistor (FET), with a gate of Q5 connected to the on-off signal 33, the source of Q5 connected to receive signal line 31 (or signal 31a with an off-chip oscillator), and the drain of Q5 is connected to the inverting input 6 of the amplifier U1B.

When switch Q5 is closed, the oscillating output of 2.7 volts peak is provided to an inverting input of amplifier U1B, which acts as a summing junction in the preferred embodiment. The summing junction of amplifier U1B sums the currents into the amplifier from the output of the feedback circuit 39, the output of the DC offset circuit 40 and the output of switch Q5. This summing of the currents from these three devices may be performed in a manner known to one of ordinary skill in the art, such as by a Wired-OR function.

When the current $I_1$ output from switch Q5 is greater than the current $I_2$ on line 34, then the ring output voltage on signal line 38 must increase in opposite polarity. In this case, the voltage V2 at summing junction 6 of the amplifier U1B is above the zero volt ground reference on pin 5, by causing the output of the amplifier U1B on pin 7 to drive low toward −5 volts. This turns Q1 of class B amplifier 37 on, which turns transistor Q4 on, thus causing the ring output 38 to increase in a negative direction. Feedback circuit 39 then increases current level I2 and the process continues until the desired output level is achieved. A similar operation occurs in the opposite direction when converting from an AC voltage to a DC voltage.

The closed loop gain is set by the resistors R15 and R16 in parallel and by resistor R1. In the preferred embodiment, resistors R15 and R16 are each 200K resistors in parallel with respect to each other, thereby forming a 100K resistor, while R1 is a 2K resistor. Thus, the closed loop AC gain is 50, since 100K/2K=50. In the preferred embodiment, the feedback circuit 39 also includes a capacitor C6 in parallel with resistors R15 and R16, with a value of 10 pF.

The DC offset is set essentially the same way as the feedback gain, with the combination of R15, R16 and R10 setting the DC gain. Thus, the DC gain is 100K/R10 in the preferred embodiment. To meet the ringing specification requirements in the United States, the DC level of the ring output signal must be −48 volts. Thus, the DC offset 41 and value of resistor R10 are set in accordance with this requirement. In the preferred embodiment, the voltages +V and −V input to the amplifier stage 37 are set to be +100 volts and −200 volts, respectively.

Because of the high gain of the ringing circuit, capacitors C6, C7 and C8 are employed to filter out high frequency noise and to improve loop stability. The high gain also helps reduce cross-over distortion which can occur on telephone lines.

Figure 5:
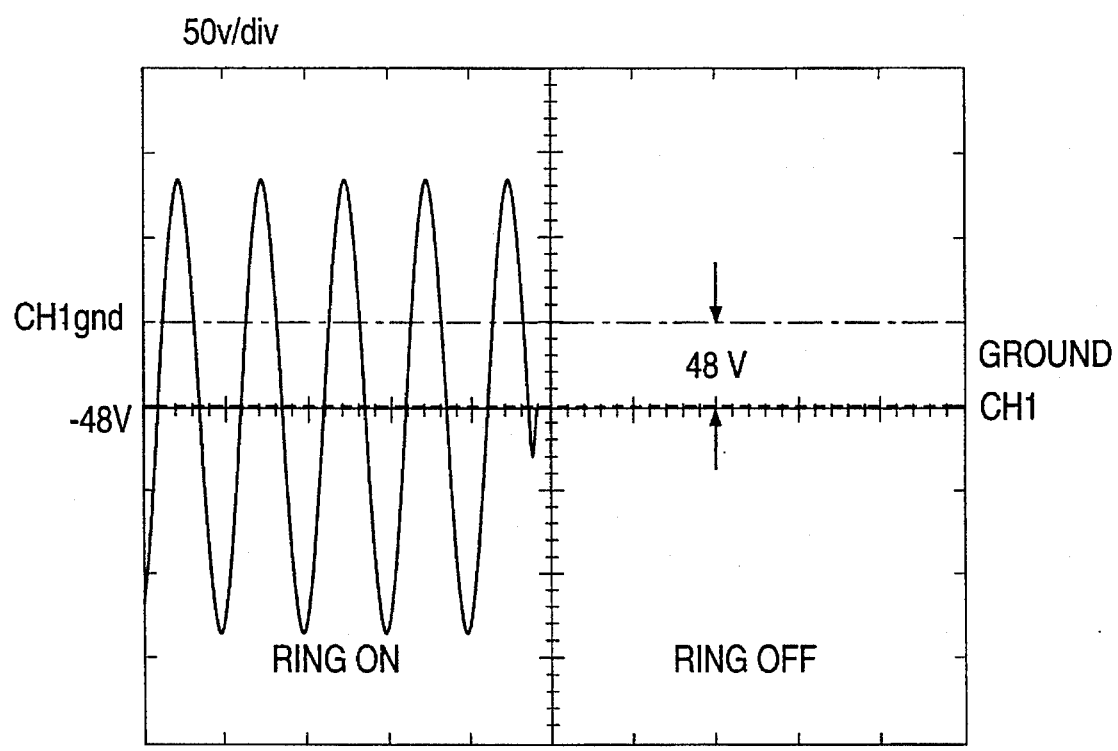
FIG. 5 shows the AC and DC voltage signals generated using the circuit according to the invention for both a ringing and a non-ringing condition.

As a consequence of the preferred embodiment described herein, the ring output signal is at −48 volts DC when no ring occurs, and the ring output signal is an AC signal of 86 volts RMS around a DC level of −48 volts in the ring mode. Both of these conditions are shown in FIG. 5.

The amplifier stage 37 includes resistors R11 and R12 in series. In the preferred embodiment, resistors R11 and R12 are 3.3 kΩ. Resistor R11 is connected in parallel to capacitor C7, and resistor R12 is connected in parallel to capacitor C8. As mentioned earlier, these capacitors filter out high frequency noise, and in the preferred embodiment are set to 47 pF.

The amplifier stage 37 also includes bipolar transistors Q1 and Q2. While these transistors are shown as bipolar transistors in the preferred embodiment, one of ordinary skill in the art would recognize that any other type of transistor could be utilized in the amplifier stage 37 in keeping with the teachings of the invention. The emitter of transistor Q2 is connected to resistor R11 and capacitor C7, the base of transistor Q2 is connected to amplifier 35 via resistor R8, and the collector of transistor Q2 is connected to the base of transistor Q3. The emitter of transistor Q1 is connected to resistor R12 and capacitor C8, the base of transistor Q1 is connected to amplifier 35 via resistor R8, and the collector of transistor Q1 is connected to the base of transistor Q4.

The emitter of transistor Q3 is connected to the +V external voltage supply, which in the preferred embodiment is +100 volts. The collector of Q3 is connected to the output port 38 of the ringing circuit. As can be seen from FIG. 3, the output port 38 is connected to the feedback circuit 39, which in FIG. 4a corresponds to the combination of R16, R15 and C6.

The emitter of transistor Q4 is connected to the −V external voltage supply, which in the preferred embodiment is −200 volts. The collector of transistor Q4 is connected to the output port 38 of the ringing circuit. Note that while +100/−200 volts are used for +V and −V, respectively, in the preferred embodiment, other combinations of supply voltages to the amplifier 38 are possible. Another embodiment of the invention would incorporate a current limiter at the output end of the amplifier 38, thereby restricting the output signal appropriately.

Results of tests performed using the circuit according to the invention described herein in the preferred embodiment reveal an output signal distortion of less than 1.5 percent for all load conditions, and an output noise level of approximately 100 millivolts peak-to-peak. The power dissipation in the idle state was measured to be 25 milliwatts, the power dissipation in the active state with a one-ring load was 550 milliwatts, and the power dissipation in the active state with a five-ringer load was 2.19 watts.

Figure 4B:
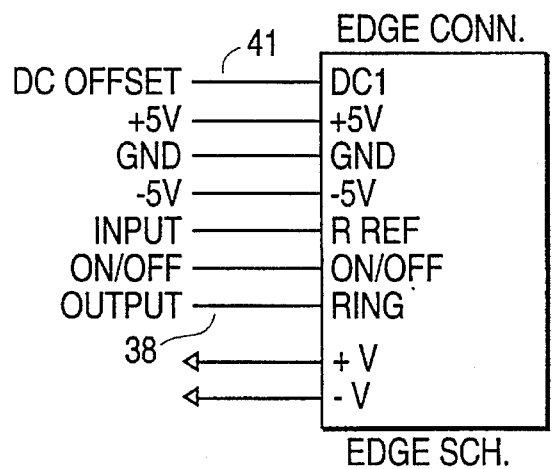
FIG. 4b illustrates the input and output pins for a circuit according to the invention to be incorporated onto a line card.

The ring generator according to the invention can be provided in an appropriate package, such as a Single In-line Package (SIP) for installation on a line card, as shown in FIG. 4b.

While preferred embodiments of the invention have been described, modification of the described embodiments may become apparent to those of ordinary skill in the art, following the teachings of the invention, without departing from the scope of the invention as set forth in the appended claims.

What is claimed is:

1. A ring generator circuit, comprising:
    a switch having an output providing an oscillating signal in response to an on condition of an on/off signal at a control input of said switch;
    a DC offset circuit receiving a DC input potential at an input port of said DC offset circuit and outputting a DC offset potential at an output port of said DC offset circuit;
    an amplifier stage, connected to said output of said switch and said output port of said DC offset circuit, wherein said amplifier stage provides a ring output; and
    a feedback circuit connected between said ring output of said amplifier stage and said output of said switch,
    said feedback circuit feeding back said ring output to an input port of said amplifier stage to reduce an output signal distortion and an output noise level of said ring output.

2. A ring generator circuit as recited in claim 1, further comprising an oscillating circuit connected to an input of said switch, wherein said oscillating circuit generates said oscillating signal at a predetermined frequency.

3. A ring generator circuit as recited in claim 1, wherein said amplifier stage comprises a class B amplifier.

4. A ring generator circuit as recited in claim 1, wherein said amplifier stage further comprises an amplifier having an inverting and a non-inverting input port, and wherein said output port of said DC offset circuit, an output of said feedback circuit and said output of said switch are all connected to said non-inverting input port of said amplifier.

5. A ring generator circuit as recited in claim 1, wherein said feedback circuit is an RC circuit, and wherein said RC circuit comprises a gain setting resistive circuit.

6. A ring generator circuit as recited in claim 1, wherein said amplifier stage comprises an amplifier with low power dissipation.

7. A ring generator circuit as recited in claim 1, wherein said output port of said DC offset circuit is directly connected to said amplifier stage for providing a DC offset voltage to said amplifier stage when said on/off signal is in an off condition.

8. A ring generator circuit as recited in claim 2, wherein said switch comprises a field effect transistor (FET), and wherein a gate of said FET is connected to said on/off signal, a source of said FET is connected to said oscillating circuit, and a drain of said FET is connected to said amplifier stage.

9. A ring generator circuit as recited in claim 2, wherein said predetermined frequency is 20 Hz.

10. A ring generator circuit as recited in claim 2, further comprising a ring detection circuit for setting said on/off signal to an on condition in response to an incoming phone call, and setting said on/off signal to an off condition otherwise.

11. A ring generator circuit as recited in claim 4, wherein said output port of said DC offset circuit, an output of said feedback circuit, and said output of said switch are connected together as a Wired-OR.

12. A ring generator circuit, comprising:
    switching means having an output port for providing an oscillating signal in response to an on condition of an on/off signal at a control input of said switching means;
    DC offsetting means receiving a DC input potential at an input port of said DC offsetting means, for outputting a DC offset potential at an output port of said DC offsetting means;
    amplification means, connected to said output port of said switching means and said output port of said DC offsetting means, for providing a ring output; and
    feedback means connected between said ring output of said amplification means and said output port of said switching means,
    said feedback means feeding back said ring output to an input port of said amplification means to reduce an output signal distortion and an output noise level of said ring output.

13. A ring generator circuit as recited in claim 12, further comprising an oscillating means connected to an input of said switching means, wherein said oscillating means generates said oscillating signal at a predetermined frequency.

14. A ring generator circuit as recited in claim 12, wherein said amplification means includes a class B amplifier.

15. A ring generator circuit as recited in claim 12, wherein said amplification means further comprises amplifier means for receiving a wired-or combination of said DC offset potential,
    said output port of said switching means and said feedback means, said amplifier means outputting a signal to said amplification means as a result thereof.

16. A ring generator circuit as recited in claim 12, wherein said feedback means is an RC circuit, and wherein said RC circuit comprises a gain setting resistive circuit.

17. A ring generator circuit as recited in claim 12, wherein said amplification means includes an amplifier with low power dissipation.

18. A line card providing ring generation for at least one telephone, said line card comprising:
    a switch having an output providing an oscillating signal in response to an on condition of an on/off signal at a control input of said switch;
    a DC offset circuit receiving a DC input potential at an input port of said DC offset circuit and outputting a DC offset potential at an output port of said DC offset circuit;
    an amplifier stage, connected to said output of said switch and said output port of said DC offset circuit, wherein said amplifier stage provides a ring output;
    a feedback circuit connected between said ring output of said amplifier stage and said output of said switch, said feedback circuit feeding back said ring output to an input port of said amplifier stage to reduce an output signal level and an output noise level of said ring output; and a housing enclosing an interior space, wherein said switch, said DC offset circuit, said amplifier stage, and said feedback circuit are disposed within said housing, and wherein said housing is operatively connected to said line card.

19. A line card as recited in claim 18, wherein said housing is a Single In-Line Package.

20. A line card providing ring generation for at least one telephone, said line card comprising:

switching means having an output port for providing an oscillating signal in response to an on condition of an on/off signal at a control input of said switching means;

DC offsetting means receiving a DC input potential at an input port of said DC offsetting means, for outputting a DC offset potential at an output port of said DC offsetting means;

amplification means, connected to said output port of said switching means and said output port of said DC offsetting means, for providing a ring output;

feedback means connected between said ring output of said amplification means and said output port of said switching means, said feedback means feeding back said ring output to an input port of said amplification means to reduce an output signal distortion and an output noise level of said ring output; and a housing enclosing an interior space, wherein said switching means, said DC offsetting means, said amplification means, and said feedback means are disposed within said housing, and wherein said housing is operatively connected to said line card.

21. A line card as recited in claim 20, wherein said housing is a Single In-Line Package.

22. A method for providing ring generation for a plurality of telephones simultaneously, comprising the steps of:

receiving an incoming telephone call to one of the plurality of telephones;

setting an on/off signal having an on condition and an off condition to said on condition based upon the incoming telephone call;

constantly providing an oscillating signal to an input of a switch;

constantly providing a DC offset potential to an input of an amplification stage;

outputting the oscillating signal from an output of the switch to the input of the amplification stage based on the on condition of the on/off signal and outputting a ring signal at an output of the amplification stage, wherein the ring signal is based on the oscillating signal; and feeding back the ring signal to the input of the amplification stage, wherein the ring signal is passed through a resistive circuit before being sent to the input of the amplification stage.

* * * * *